United States Patent
Wang et al.

(10) Patent No.: US 11,501,690 B2
(45) Date of Patent: Nov. 15, 2022

(54) ARRAY SUBSTRATE, METHOD OF DRIVING ARRAY SUBSTRATE, AND DISPLAY DEVICE

(71) Applicant: Beijing BOE Technology Development Co., Ltd., Beijing (CN)

(72) Inventors: Li Wang, Beijing (CN); Ling Shi, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 227 days.

(21) Appl. No.: 16/492,839

(22) PCT Filed: Apr. 1, 2019

(86) PCT No.: PCT/CN2019/080841
§ 371 (c)(1),
(2) Date: Sep. 10, 2019

(87) PCT Pub. No.: WO2019/192430
PCT Pub. Date: Oct. 10, 2019

(65) Prior Publication Data
US 2021/0327336 A1  Oct. 21, 2021

(30) Foreign Application Priority Data
Apr. 3, 2018 (CN) .......................... 201810291270.0

(51) Int. Cl.
*G09G 3/20* (2006.01)
*G09G 3/3266* (2016.01)
*G11C 19/28* (2006.01)

(52) U.S. Cl.
CPC ......... *G09G 3/2092* (2013.01); *G09G 3/3266* (2013.01); *G11C 19/28* (2013.01);
(Continued)

(58) Field of Classification Search
CPC ........... G11C 19/28; G09G 2310/0286; G09G 2300/0408; G09G 2300/0426;
(Continued)

(56) References Cited

U.S. PATENT DOCUMENTS

2017/0178583 A1* 6/2017 Zhang ................. G09G 3/3677
2017/0352328 A1* 12/2017 Jeong ................. G09G 3/3283
(Continued)

FOREIGN PATENT DOCUMENTS

| CN | 105096886 A | 11/2015 |
|----|-------------|---------|
| CN | 107346650 A | 11/2017 |
| CN | 108682372 A | 10/2018 |

*Primary Examiner* — Xuemei Zheng
(74) *Attorney, Agent, or Firm* — Banner & Witcoff, Ltd.

(57) ABSTRACT

An array substrate, a method of driving an array substrate, and a display device are provided. The array substrate includes a display area, a slotting area, and a peripheral area, and the display area includes: a first area, which is in at least one side of the slotting area, and a second area which does not overlap with the first area. The array substrate includes a plurality of pixel units and a gate drive circuit. The gate drive circuit includes: a plurality of first shift register units, which are configured to drive a plurality of rows of pixel units in the first area, and a plurality of second shift register units which are configured to drive a plurality of rows of pixel units in the second area. A drive capability of a first shift register unit is lower than a drive capability of a second shift register unit.

9 Claims, 6 Drawing Sheets

(52) U.S. Cl.
CPC ............... *G09G 2310/0286* (2013.01); *G09G 2320/0223* (2013.01); *G09G 2320/0233* (2013.01)

(58) Field of Classification Search
CPC ......... G09G 2320/0223; G09G 3/3677; G09G 3/3266; G09G 3/2092; G09G 2320/0233
See application file for complete search history.

(56) References Cited

U.S. PATENT DOCUMENTS

| | | | |
|---|---|---|---|
| 2018/0005585 A1* | 1/2018 | Kim | G09G 3/3266 |
| 2018/0137805 A1 | 5/2018 | Zheng et al. | |
| 2018/0204889 A1* | 7/2018 | Yu | H01L 27/3223 |

* cited by examiner

ARRAY SUBSTRATE, METHOD OF DRIVING ARRAY SUBSTRATE, AND DISPLAY DEVICE

The application is a U.S. National Phase Entry of International Application No. PCT/CN2019/080841 filed on Apr. 1, 2019, designating the United States of America and claiming priority to Chinese Patent Application No. 201810291270.0, filed on Apr. 3, 2018. The present application claims priority to and the benefit of the above-identified applications and the above-identified applications are incorporated by reference herein in their entirety.

TECHNICAL FIELD

Embodiments of the present disclosure relate to an array substrate, a method of driving an array substrate, and a display device.

BACKGROUND

With the advent of the era of full screen, a slotting design of a camera at a top of a display screen gradually becomes a trend, that is, it needs to perform slotting on a display area of the display screen, and the camera is arranged at the slotting position. Therefore, an area of the display screen can be enlarged without affecting the function of the camera, which can be helpful to realizing the full screen and providing a better experience for users.

SUMMARY

At least one embodiment of the present disclosure provides an array substrate, which includes a display area, a slotting area, and a peripheral area around the display area, the display area comprises: a first area, which is in at least one side of the slotting area, and a second area which does not overlap with the first area, and the array substrate comprises: a plurality of pixel units in the display area and arranged in a plurality of rows; and a gate drive circuit in the peripheral area. The gate drive circuit comprises: a plurality of first shift register units, which are configured to drive a plurality of rows of pixel units in the first area, and a plurality of second shift register units which are configured to drive a plurality of rows of pixel units in the second area, and a drive capability of a first shift register unit is lower than a drive capability of a second shift register unit.

For example, in the array substrate provided by an embodiment of the present disclosure, the display area further comprises a transition area, and the transition area is between the first area and the second area.

For example, in the array substrate provided by an embodiment of the present disclosure, the gate drive circuit further comprises a plurality of third shift register units configured to drive a plurality of rows of pixel units in the transition area, and a drive capability of a third shift register unit is between the drive capability of the first shift register unit and the drive capability of the second shift register unit.

For example, in the array substrate provided by an embodiment of the present disclosure, the plurality of third shift register units are divided into a plurality of groups of third shift register units, drive capabilities of respective groups of third shift register units are different, and in the plurality of groups of third shift register units, drive capabilities of a group of third shift register units close to the first area are lower than drive capabilities of a group of third shift register units close to the second area.

For example, in the array substrate provided by an embodiment of the present disclosure, at least one group of the plurality of groups of third shift register units comprises a first amount of third shift register units, and drive capabilities of the first amount of third shift register units in a same group are identical.

For example, in the array substrate provided by an embodiment of the present disclosure, each group of the plurality of groups of third shift register units comprises one third shift register unit, and drive capabilities of the plurality of third shift register units gradually decrease in a direction from the second area to the first area.

For example, in the array substrate provided by an embodiment of the present disclosure, drive capabilities of the plurality of first shift register units are different, amounts of pixel units in respective rows in the plurality of rows of pixel units driven by the plurality of first shift register units are different, and the drive capability of respective first shift register unit is in a positive correlation with an amount of pixel units in a row corresponding to the respective first shift register unit.

For example, in the array substrate provided by an embodiment of the present disclosure, amounts of pixel units in respective rows in the first area gradually decrease in a direction away from the second area, and drive capabilities of first shift register units corresponding to the respective rows gradually decrease.

For example, in the array substrate provided by an embodiment of the present disclosure, the first shift register unit comprises a first drive transistor, the second shift register unit comprises a second drive transistor, the third shift register unit comprises a third drive transistor, the drive capability of the first shift register unit is in a positive correlation with a width-to-length ratio of a channel of the first drive transistor, the drive capability of the second shift register unit is in a positive correlation with a width-to-length ratio of a channel of the second drive transistor, and the drive capability of the third shift register unit is in a positive correlation with a width-to-length ratio of a channel of the third drive transistor.

For example, in the array substrate provided by an embodiment of the present disclosure, each of the first shift register unit, the second shift register unit, and the third shift register unit comprises: an input circuit, connected to a first node and configured to write an input signal to the first node in response to the input signal; and an output circuit, connected to the first node and configured to output a clock signal that is received to an output terminal under control of a level of the first node, and an output circuit of the first shift register unit comprises the first drive transistor, an output circuit of the second shift register unit comprises the second drive transistor, and an output circuit of the third shift register unit comprises the third drive transistor.

For example, in the array substrate provided by an embodiment of the present disclosure, the first area is in both sides of the slotting area.

At least one embodiment of the present disclosure also provides a method of driving an array substrate, the array substrate comprises a display area, a slotting area, and a peripheral area around the display area, and the method of driving the array substrate comprises: driving pixel units of a first area in the display area through first shift register units, the first area being in at least one side of the slotting area, and the display area further comprising a second area which does not overlap with the first area; and driving pixel units of the second area through second shift register units.

A drive capability of a first shift register unit is lower than a drive capability of a second shift register unit.

For example, in the method provided by an embodiment of the present disclosure, the display area further comprises a transition area, the transition area is between the first area and the second area, and the method further comprises: driving pixel units of the transition area through third shift register units. A drive capability of a third shift register unit is between the drive capability of the first shift register unit and the drive capability of the second shift register unit.

At least one embodiment of the present disclosure also provides a display device, which includes the array substrate according to any one of the embodiments of the present disclosure.

BRIEF DESCRIPTION OF THE DRAWINGS

The accompanying drawings, which are incorporated in and constitute a part of the specification, illustrate embodiments consistent with the disclosure, and are used to explain the principles of the disclosure together with the description. It is obvious that the drawings in the following description are only some embodiments of the present disclosure and are not a limitation of the present disclosure. For those of ordinary skill in the art, other drawings can be obtained according to these drawings without creative labor.

DETAILED DESCRIPTION

Figure 1:
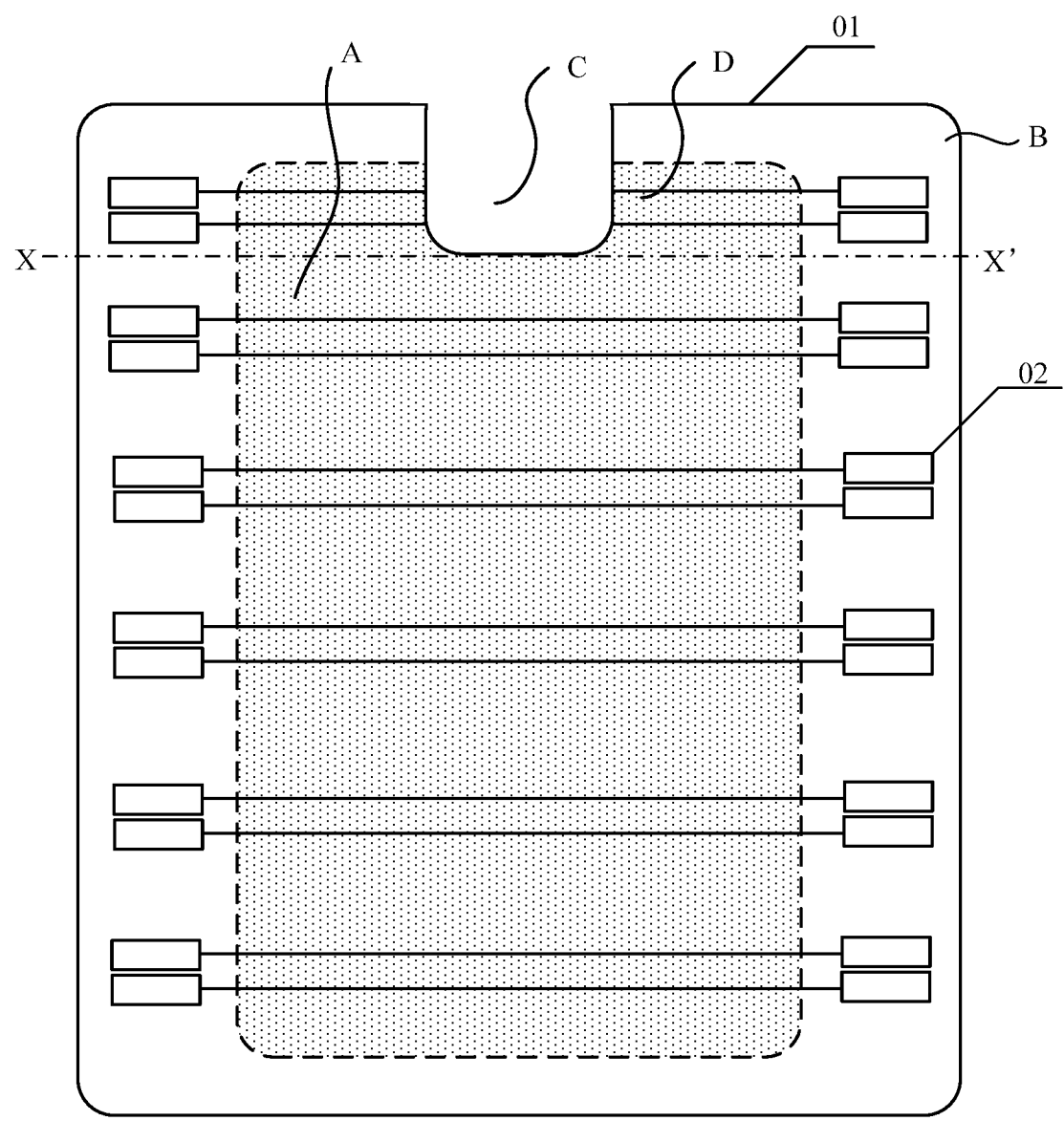
FIG. 1 is a schematic diagram of an array substrate.

Exemplary embodiments are described more fully with reference to the accompanying drawings now. However, the exemplary embodiments can be implemented in many forms and should not be construed as limitation to the examples set forth herein; on the contrary, these embodiments are provided so that the present disclosure is thorough and complete, and can fully convey the concept of the exemplary embodiments to those skilled in the art. The drawings are merely schematic illustrations of the present disclosure and are not necessarily drawn according to scale. The same reference numerals in the drawings refer to the same or similar parts, and thus repeated descriptions thereof are omitted.

Furthermore, the described features, structures, or characteristics may be combined in any suitable manner in one or more embodiments. In the following description, a plurality of specific details are provided in order to provide a thorough understanding of the embodiments of the present disclosure. However, those skilled in the art can recognize that the technical solution of the present disclosure may be practiced with omitting one or more of the specific details, or other methods, components, devices, steps, etc. may be employed. In other cases, well-known structures, methods, devices, implementations, materials, or operations are not illustrated or described in detail to avoid that the wrangling guest robes the place of the host so that aspects of the present disclosure are blurred.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a case where a display area of a display screen is slotted, pixels in a slotting position (i.e., a slotting area) of the display area (i.e., AA area) are absent, which may also result in display non-uniformity of the screen.

In order to solve the problem of display non-uniformity, a RC load of a gate driver on array (GOA) circuit is usually compensated to enable that loads of shift register units in the slotting area are consistent with loads of shift register units in non-slotting area, so as to achieve the uniformity of the screen display. However, the compensation of the RC load may occupy the finite space of the display screen, and it is difficult to realize narrow frame. Moreover, the compensation of the RC load may also cause that the circuit structure becomes more complicated.

The embodiments of the present disclosure provide an array substrate, a method of driving an array substrate, and a display device, which at least, in a certain extent, overcomes the problem that a narrow frame is difficult to realize due to a load compensation mode for solving the display uniformity in the related art.

According to the array substrate, the method of driving the array substrate, and the display device provided by the embodiments of the present disclosure, on the one hand, shift register units with different drive capacities are respectively used for driving a first area in at least one side of the slotting area and a second area, which does not overlapped with the first area, in the display area, so that the purpose of balancing the drive capacity and the load is achieved without additionally adding a compensation circuit, the problem of non-uniformity of brightness can be solved, and the narrow frame of the display screen can be realized; and on the other hand, because the brightness of the first area and the brightness of the second area can smoothly change, a better uniformity of display effect can be achieved.

For example, FIG. 1 is a schematic diagram of a full screen having a slotting area, and FIG. 1 mainly illustrates a schematic diagram of an array substrate in the full screen. As illustrated in FIG. 1, an array substrate 01 includes a display area and a peripheral area B, the peripheral area B is on an outer periphery of the display area, and the display area has a slotting area C at the top of the display area. So the display area can be divided into two parts by a division line X-X', namely, the two parts include an area A (i.e., a display area corresponding to a non-slotting area) on a lower side of the division line X-X' and an area D (i.e., a display area corresponding to the slotting area C), which is on a upper side of the division line X-X' and in both sides of the slotting area C. For example, a gate drive circuit (hereinafter referred to as "GOA circuit") needs to be provided in the peripheral area B. The GOA circuit includes a plurality of shift register units (hereinafter referred to as "GOA units") 02. Due to the arrangement of the slotting, pixel units in the area D are driven in a single-ended manner by the GOA units. Pixel units in the area A also need to be driven by the GOA units, but the difference from the GOA units in the area D is that the GOA units 02 are provided in the peripheral area in both sides of the area D, and the pixel units in the area A are driven in a double-ended manner by the GOA units. In this way, a drive capability of the GOA circuit driving the area A is different from a drive capability of the GOA circuit driving the area D. In addition, because some pixels in the display area are absent, loads of the GOA units are also different, resulting in non-uniformity of display of the screen.

Based on the above problems, the RC load of the GOA circuit is usually compensated to ensure that the load of the GOA unit in the display area corresponding to the slotting area is consistent with the load of the GOA unit in the display area corresponding to the non-slotting area, so as to realize the display uniformity of the display screen, which can include following two methods.

In method 1, a compensation circuit is added at an end of the GOA unit (that is, an end extending along a direction from the GOA unit as a starting end to the display area) of the display area (the area D) corresponding to the slotting area.

In method 2, ends of GOA units in both sides of the display area (the area D) corresponding to the slotting area are connected, and also connected to a compensation circuit below the slotting area.

Figure 2:
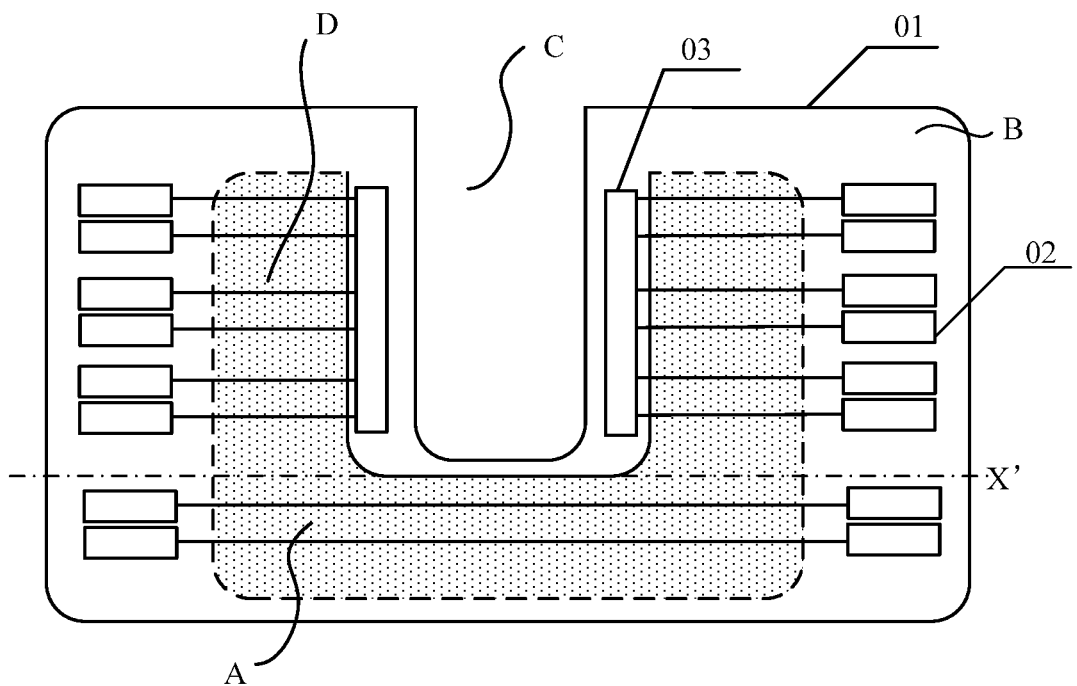
FIG. 2 is a schematic diagram of a circuit design to enable loads consistent.

FIG. 2 is a schematic diagram of a circuit design by using the method 1 to enable the loads consistent. As illustrated in FIG. 2, compensation circuits 03 are added at the ends of the GOA units 02 in both sides of the area D, so two compensation circuits 03 need to be added, and the compensation circuits can be RC loads, specifically.

Figure 3:
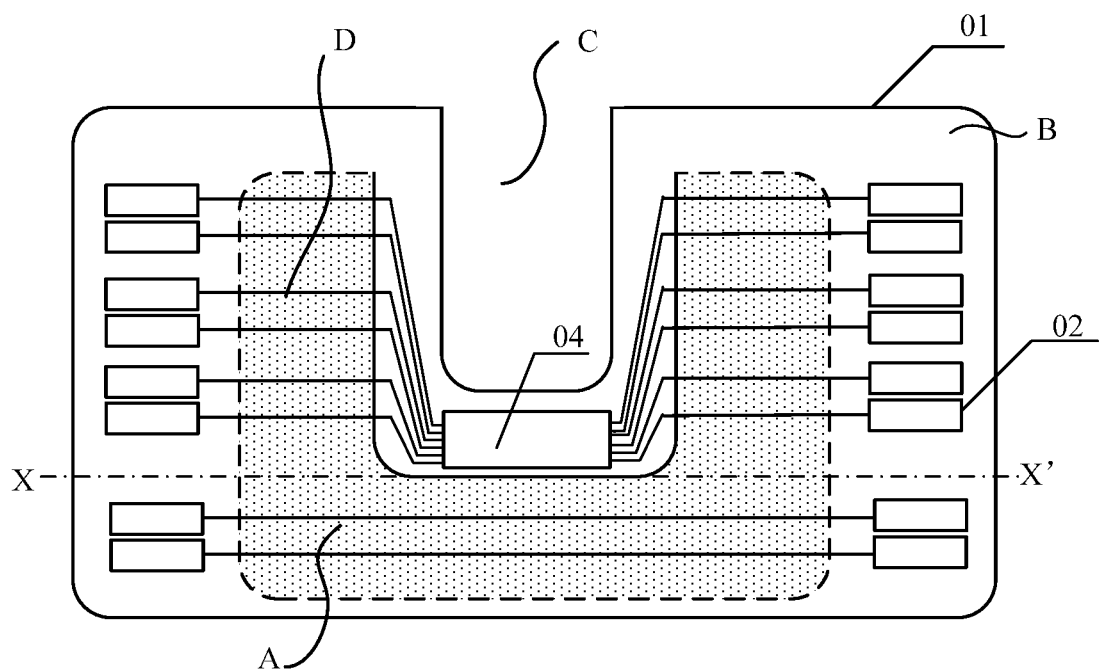
FIG. 3 is a schematic diagram of another circuit design to enable the loads consistent.

FIG. 3 is a schematic diagram of a circuit design by using the method 2 to enable the loads consistent. As illustrated in FIG. 3, the ends of GOA units 02 in both sides of the area D are connected to realize a double-ended drive, a compensation circuit 04 is connected below the slotting area C, and the compensation circuit can be a RC load, specifically.

The method 1 and the method 2 both compensate the load in the slotting area which is smaller than the load in the non-slotting area by increasing the RC load, so as to achieve the purpose of uniform load. However, due to the existence of the RC compensation circuit in the above two compensation circuits and the above compensation methods, the width of the frame in the slotting area of the display screen is increased. For example, the width of the frame in both sides of the slotting area increases by using the method 1, and the width of the frame below the slotting area increases by using the method 2. The larger the size of the slotting area, the larger the space occupied by the compensation circuit and the wires, and thus the wider the frame around the slotting area, which is extremely unfavorable for realizing the goal of the full screen with a narrow frame.

Figure 4:
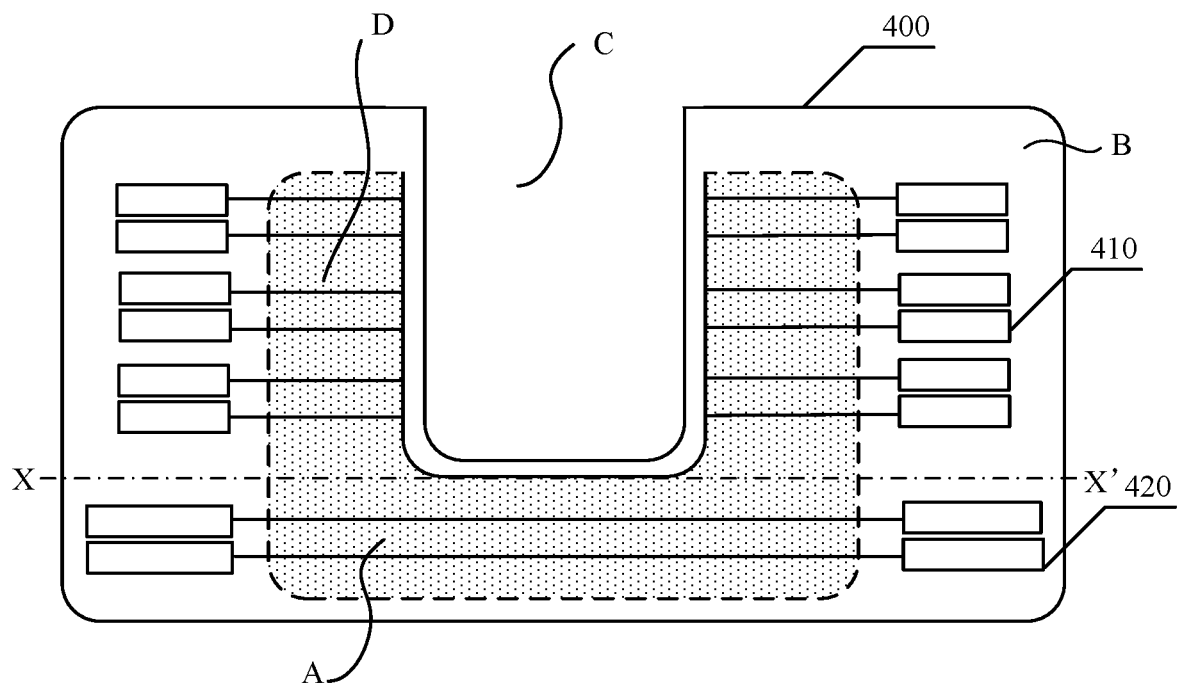
FIG. 4 is a schematic diagram of an array substrate provided by some exemplary embodiments of the present disclosure.

FIG. 4 is a schematic diagram of an array substrate provided by some exemplary embodiments of the present disclosure. As illustrated in FIG. 4, an array substrate 400 includes a display area, a slotting area C, and a peripheral area B around the display area. The array substrate 400 includes pixel units and a GOA circuit. A plurality of pixel units are in the display area and arranged in a plurality of rows. The display area includes a first area D, which is in at least one side (e.g., both sides) of the slotting area C, and a second area A which does not overlap with the first area D. The first area D and the second area A are separated by the division line X-X'. For example, in this example, the second area A is an area other than the first area D in the display area, that is, the display area includes only the first area D and the second area A. For example, in other examples, the display area further includes other areas in addition to the first area D and the second area A, such as a transition area described below. The GOA circuit includes a plurality of GOA units which are provided in the peripheral area B, e.g., includes a plurality of first shift register units (hereinafter referred to as "first GOA units") 410, which are configured to drive a plurality of rows of pixel units in the first area D, and a plurality of second shift register units (hereinafter referred to as "second GOA units") 420 which are configured to drive a plurality of rows of pixel units in the second area A. For example, a drive capability of the first GOA unit 410 is lower than a drive capability of the second GOA unit 420.

It should be noted that in some other embodiments of the present disclosure, in a case where the slotting area C is not on a central axis of the array substrate 400 and is biased toward one side of the array substrate 400, the first area D may be in only one side of the slotting area C, which does not affect the setting of the drive capability of the first GOA unit and the drive capability of the second GOA unit.

Based on the above description, in the exemplary embodiment, GOA units with different drive capabilities are used to respectively drive the first area in at least one side (e.g., both sides) of the slotting area and the second area other than the first area in the display area, so as to achieve the purpose of balancing the drive and load without additionally adding compensation circuits, which can not only alleviate the problem of non-uniformity of brightness, but also realize the narrow frame of the display screen.

Hereinafter, the above-mentioned array substrate is described in detail with reference to FIG. 4 and specific embodiments.

In an exemplary embodiment, the array substrate includes a plurality of pixel units in the display area and a GOA circuit in the peripheral area. The GOA technology is a technology that integrates a gate driver IC on the array substrate. Each pixel unit includes a pixel circuit, and the pixel circuit includes a thin film transistor, a pixel electrode, a common electrode, etc. The pixel unit and the pixel circuit are the same as those in the conventional technology and are not described in detail here again. The GOA circuit includes a plurality of gate lines, a plurality of GOA units, and various input signal lines (such as clock signal lines, etc.), a terminal of the gate line is connected to the pixel unit, and the other terminal of the gate line is connected to the GOA unit. The structure and composition of the GOA units are the same as those of the conventional technology, and are not described in detail here again.

It should be noted that, the GOA unit includes one or more circuits such as an input circuit, a drive circuit, an output circuit, a control circuit, a buffer circuit, a pull-up circuit, a pull-down circuit, a hold circuit, a charge circuit, a discharge circuit, and the like, which can be specifically changed according to circuit requirements and are not described here.

The drive circuit or the output circuit includes a drive transistor, and a MOS transistor is usually used as the drive transistor. The drive capability of the GOA unit is related to a size of the drive transistor. The larger the size of the drive transistor, the greater the drive capability of the GOA unit. The specific reasons are as follows. The MOS transistor forms a conductive channel between a source electrode of the MOS transistor and a drain electrode of the MOS transistor. The larger a width-to-length ratio W/L (i.e., a ratio of a width W to a length L) of the conductive channel of the MOS transistor, the larger a source-to-drain current Ids of the MOS transistor. A formula of the source-to-drain current Ids is as follows:

$$Ids=1/2*\mu*C*(W/L)*(Vgs-Vth)^2,$$

where $\mu$ is a carrier mobility of the transistor, C is a gate oxide capacitance per unit area of the transistor, W/L is the width-to-length ratio of the channel of the transistor, Vgs is a voltage between a gate electrode of the MOS transistor and the source electrode of the MOS transistor, and Vth is a turn-on voltage (or threshold voltage) of the transistor.

Generally, on a premise that the length L of the MOS transistor is constant, the current Ids of the drive transistor is in a positive correlation (e.g., a positive proportional relationship) with the width W of the channel, so that it can be seen that the drive capability of the GOA unit is in a positive correlation (e.g., a positive proportional relationship, i.e., a positive proportional relationship with the width W of the channel) with the width-to-length ratio of the channel of the drive transistor. Increasing the size of the drive transistor is helpful to enhance an output capability of the circuit, which can be reflected in improving a rising edge time Trise and a falling edge time Tfall. The lager the load, the longer the delay time on the signal line, so the rising edge time Trise and the falling edge time Tfall of the signal are longer, i.e., Trise & Tfall=k*RC, where k is a coefficient, and RC represents the amount of the load.

In the exemplary embodiment, the drive capability of respective first GOA unit is in a positive proportional relationship with an amount of pixel units in a row corresponding to the respective first GOA unit in the first area. That is, taking a row of pixel units in the first area and a row of pixel units in the second area as an example, an amount of pixel units in one side of the slotting area C (that is, an amount of pixel units driven by each first GOA unit) is less than an amount of pixel units in the lower side of the slotting area C (that is, an amount of pixel units driven by each second GOA unit). Therefore, from the second area A to the first area D, as the amount of the pixel units decreases, the load decreases, and the drive capability of the corresponding GOA unit should also decrease, so as to achieve the balance of the drive capability and the load, which can solve the problem of non-uniformity of display brightness generated in a case where the drive capability does not match with the load.

According to the array substrate as illustrated in FIG. 4, different from the case where the circuit is improved, i.e., balancing the load and the drive capability by adding a compensation circuit (i.e., increasing the load), the load and the drive capability are balanced by driving pixel units using GOA units with different drive capabilities according to different amounts of the pixel units driven by different GOA units, so that there is no need to add a compensation circuit.

Figure 5:
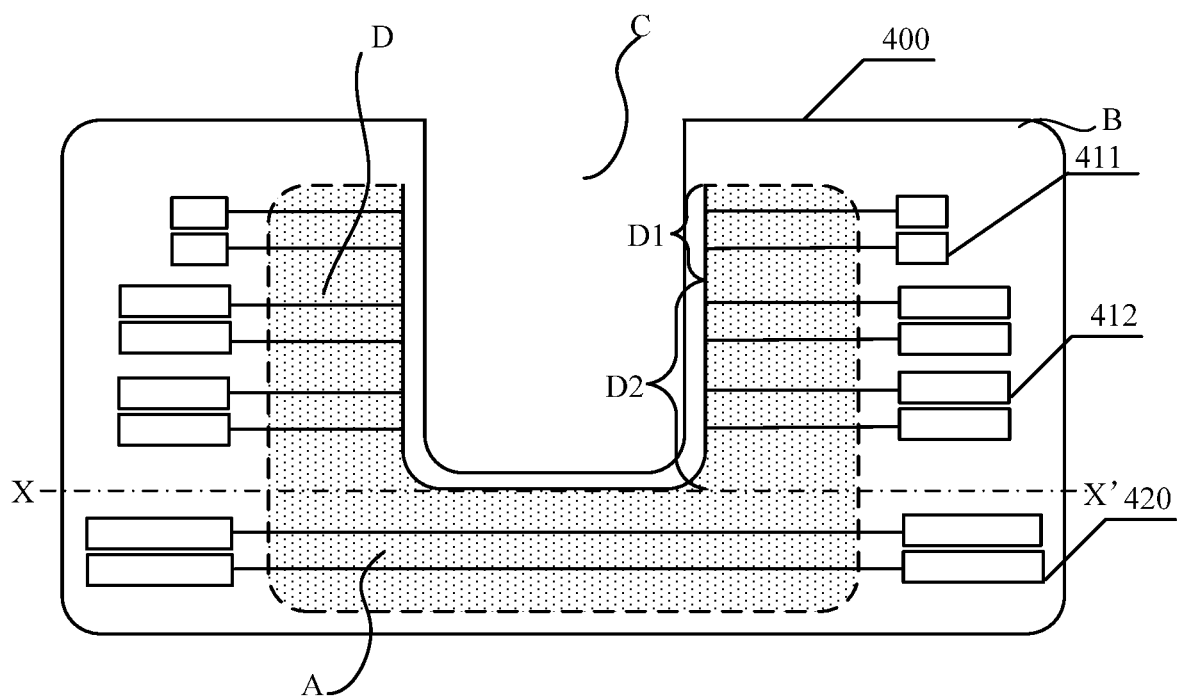
FIG. 5 is a schematic diagram of an array substrate provided by other exemplary embodiments of the present disclosure.

FIG. 5 is a schematic diagram of an array substrate provided by other exemplary embodiments of the present disclosure. As illustrated in FIG. 5, the array substrate 400 as illustrated in FIG. 5 differs from the array substrate as illustrated in FIG. 4 in that a transition area is further included in both sides of the slotting area C in the array substrate 400, i.e., both sides of the slotting area is divided into a first area D1 and a transition area D2, and the transition area D2 is between the first area D1 and the second area A.

Correspondingly, the GOA circuits in both sides of the slotting area C include not only the first GOA units 411, which are configured to drive the pixel units of the first area D1, but also third shift register units (hereinafter referred to as "third GOA units") 412, which are configured to drive pixel units of the transition area D2, and a drive capability of the third GOA unit 412 is between the drive capability of the first GOA unit 411 and the drive capability of the second GOA unit 420.

Based on the introduction of the array substrate as illustrated in FIG. 4, a size of a drive transistor in the third GOA unit 412 is between the size of the drive transistor in the first GOA unit 411 and the size of the drive transistor in the second GOA unit 420.

It should be noted that the change in the amount of pixel units in the display area in both sides of the slotting area in the drawings of the present disclosure does not consider a design of chamfering on an edge of the display area in the drawings, but mainly considers the change in the amount of pixel units caused by slotting.

Figure 6:
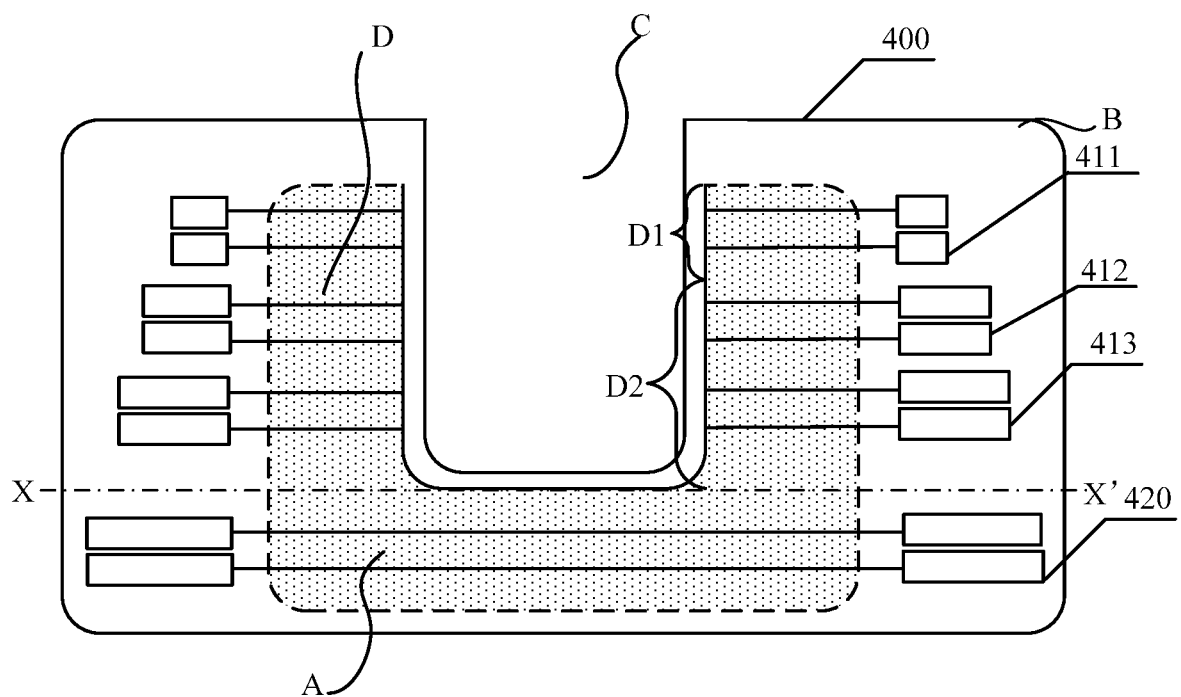
FIG. 6 is a schematic diagram of an array substrate provided by other exemplary embodiments of the present disclosure.

FIG. 6 is a schematic diagram of an array substrate provided by other exemplary embodiments of the present disclosure. As illustrated in FIG. 6, the array substrate 400 as illustrated in FIG. 6 also includes the transition area in both sides of the slotting area C, but differs from the array substrate as illustrated in FIG. 5 in that pixel units in the transition area D2 are not driven by drive transistors with the same size, but driven by drive transistors with more than two sizes. For example, a plurality of third GOA units are divided into a plurality of groups, and drive capabilities of respective groups of third shift GOA units are different, and in the plurality of groups of third GOA units, drive capabilities of a group of third GOA units close to the first area D1 are lower than drive capabilities of a group of third GOA units close to the second area A. For example, at least one group (e.g., each group) of the plurality of groups of third GOA units includes a first amount of third GOA units, and drive capabilities of the first amount of third GOA units in a same group of third GOA units are identical. Taking the embodiment as illustrated in FIG. 6 as an example, two sizes of drive transistors, namely two groups of third GOA units with two different drive capabilities, that is, one group of third GOA units 412 and another group of third GOA units 413, are provided in the transition area D2. As illustrated in FIG. 6, the group of third GOA units 412 is close to the first area D1, and the group of third GOA units 413 is close to the second area A, so drive capabilities of the group of third GOA units 412 are lower than drive capabilities of the group of third GOA units 413.

It should be noted that in a case where the transition area D2 includes three or more third GOA units, drive capabilities of these third GOA units may also gradually change or change in groups, and the embodiments of the present disclosure are not limited to this case. For example, in other embodiments, each group of the plurality of groups of third GOA units includes only one third GOA unit, and drive capabilities of the plurality of groups of third GOA units gradually decrease in a direction from the second area A to the first area D1, i.e., the drive capabilities of the plurality of third GOA units in the transition area D2 gradually decrease in the direction from the second area A to the first area D1.

The array substrate as illustrated in FIG. 5 and FIG. 6 can realize a smooth transition of display brightness from the first area to the second area due to the arrangement of the transition area, further playing a role of ensuring uniformity of display brightness of the display screen. The third GOA units as illustrated in FIG. 5 for driving pixel units in the transition area have the same drive capability and have relatively simple design. The drive capabilities of the third GOA units as illustrated in FIG. 6, which are configured to drive the pixel units in the transition area, also gradually change, which can further improve the uniformity of the brightness of the display screen.

It should be noted that a height of the transition area (i.e., an amount of rows of pixel units included in the transition area) or a ratio of the height of the transition area to a height of the slotting area can be changed according to design requirements, and for example, the ratio of the height of the transition area to the height of the slotting area can be 1/2, 1/3, etc. In a case where the slotting area corresponds to 20 rows of pixel units, the amount of pixel units in the transition area may be 10 rows, 5 rows, or any other amount of rows.

Figure 7:
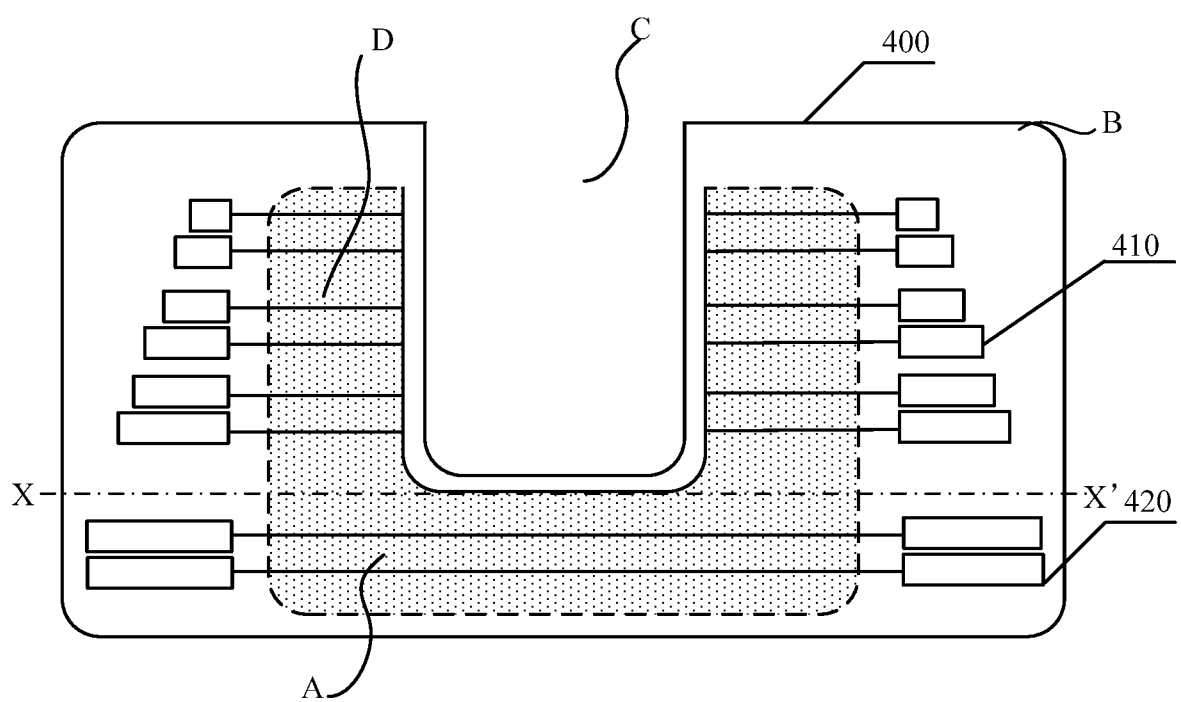
FIG. 7 is a schematic diagram of an array substrate provided by other exemplary embodiments of the present disclosure.

FIG. 7 is a schematic diagram of an array substrate provided by other exemplary embodiments of the present disclosure. As illustrated in FIG. 7, the array substrate differs from the array substrate as illustrated in FIG. 5 and FIG. 6 in that there is no transition area in both sides of the slotting area C in the array substrate 400 as illustrated in FIG. 7, but the drive capabilities of the plurality of first GOA units 410 which are configured to drive the pixel units in the first area gradually change, i.e., amounts of pixel units in respective rows of the first area D are gradually reduced along a direction away from the second area A, and the drive capabilities of the plurality of first GOA units 410 are gradually reduced, i.e., the size of the drive transistor is gradually reduced. In this embodiment, the drive capabilities of the plurality of first GOA units 410 are different, amounts of pixel units in respective rows in the plurality of rows of pixel units driven by the plurality of first GOA units 410 are different, and a variation trend of the drive capabilities of the first GOA units 410 is consistent with a variation trend of the amount of pixel units in respective rows.

Although no transition area is provided as illustrated in FIG. 7, the drive capabilities of the plurality of first GOA units corresponding to the entire first area are in a progressive trend, which can realize smooth progression and solve the problem of poor uniformity of screen display.

Figure 8:
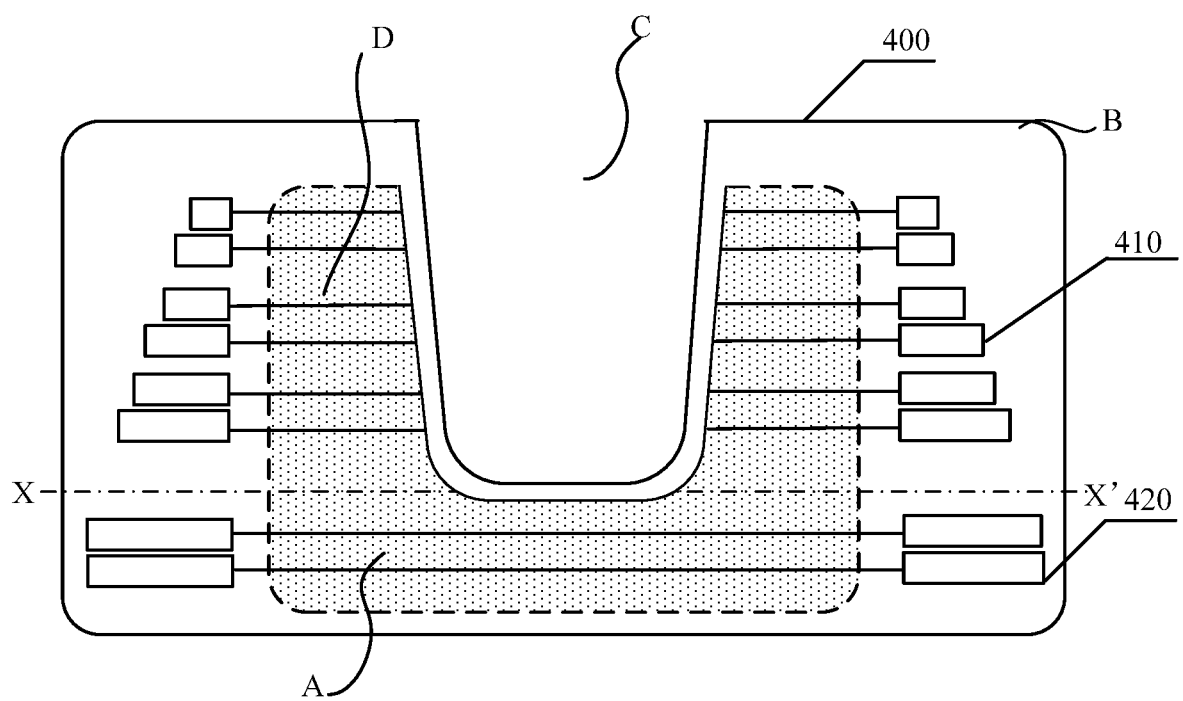
FIG. 8 is a schematic diagram of an array substrate provided by other exemplary embodiments of the present disclosure.

FIG. 8 is a schematic diagram of an array substrate provided by other exemplary embodiments of the present disclosure. As illustrated in FIG. 8, the array substrate differs from the array substrate as illustrated in FIGS. 4-7 in that the width of the slotting area C is not consistent but varies. The slotting area C gradually widens in a direction away from the second area, and correspondingly, the amount of pixel units in the respective rows decreases in the direction away from the second area, so the drive capabilities of the plurality of first GOA units also gradually decrease.

What is illustrated in FIG. 8 is only an example. In a case where the slotting area is a regular pattern or an irregular pattern other than the pattern as illustrated in FIG. 4 and FIG. 8, as long as the amount of pixel units in each row changes due to slotting, a drive capability of a first GOA unit corresponding to each row needs to be adjusted in a certain positive proportion to the amount of pixel units, which is not repeated here again.

It should be noted that the sizes of the GOA units as illustrated in FIGS. 4-8 are all used to schematically show the difference of their corresponding drive capabilities. It should be noted that the drive capability is determined according to the width-to-length ratio of the conductive channel of the drive transistor in the actual manufacturing and processing process.

Figure 9:
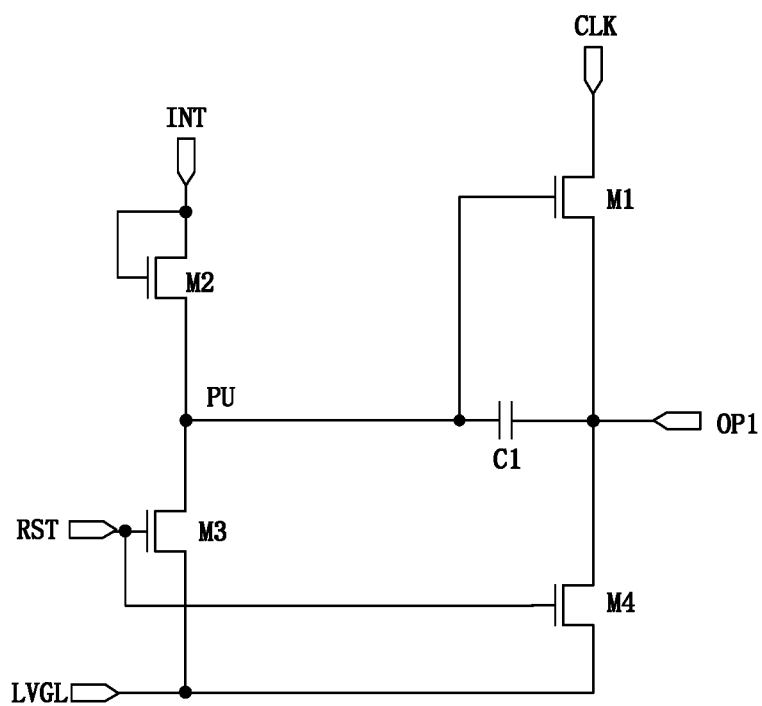
FIG. 9 is a circuit schematic diagram of a shift register unit.

FIG. 9 is a circuit diagram of a shift register unit. As illustrated in FIG. 9, the shift register unit includes an input circuit 110, an output circuit 120, a first node noise reduction circuit 130, and an output noise reduction circuit 140. For example, the shift register unit includes a first transistor to a fourth transistor M1-M4 and a first capacitor C1. In the following description, each transistor is illustrated as an N-type transistor, but this does not constitute a limitation to the embodiments of the present disclosure. For example, the first shift register unit 410, the second shift register unit 420, and the third shift register unit 412 may all adopt the circuit structure.

The output circuit 120 is connected to a first node PU and is configured to output a clock signal that is received to an output terminal OP1 under control of a level of the first node PU. For example, the output circuit 120 may be implemented as the first transistor M1 and the first capacitor C1. The first transistor M1 is a drive transistor. A gate electrode of the first transistor M1 is configured to be connected to the first node PU, a first electrode of the first transistor M1 is configured to be connected to a clock signal terminal CLK to receive the clock signal, and a second electrode of the first transistor M1 is configured to be connected to the output terminal OP1. A first electrode of the first capacitor C1 is configured to be connected to the first node PU, and a second electrode of the first capacitor C1 is configured to be connected to the output terminal OP1. In a case where the first node PU is at an effective level (e.g., a high level), the first transistor M1 is turned on, so that the first transistor M1 can receive the clock signal of the clock signal terminal CLK, and a scanning signal is output through the output terminal OP1. A width-to-length ratio of a channel of the first transistor M1 determines the drive capability of the first transistor M1, and the drive capability of the first transistor M1 is the drive capability of the shift register unit.

The input circuit 110 is connected to the first node PU and is configured to write an input signal to the first node PU in response to the input signal. For example, the input circuit 110 may be implemented as a second transistor M2. A gate electrode of the second transistor M2 is connected to a first electrode of the second transistor M2 and is configured to be connected to an input terminal INT to receive the input signal, and a second electrode of the second transistor M2 is configured to be connected to the first node PU. In a case where the input signal of the input terminal INT is at an effective level (e.g., a high level), the second transistor M2 is turned on, and the input signal charges the first node PU to enable the first node PU to be at a high level.

The first node noise reduction circuit 130 may be implemented as a third transistor M3. A gate electrode of the third transistor M3 is configured to be connected to a noise reduction control signal terminal RST, a first electrode of the third transistor M3 is configured to be connected to the first node PU, and a second electrode of the third transistor M3 is configured to be connected to a first voltage terminal LVGL. In a case where a noise reduction control signal of the noise reduction control signal terminal RST is at an effective level (e.g., a high level), the third transistor M3 is turned on, and electrically connects the first node PU and the first voltage terminal LVGL, so that the first node PU can be pulled down to a low level to perform noise reduction.

The output noise reduction circuit 140 may be implemented as the fourth transistor M4. A gate electrode of the fourth transistor M4 is configured to be connected to the noise reduction control signal terminal RST, a first electrode of the fourth transistor M4 is configured to be connected to the output terminal OP1, and a second electrode of the fourth transistor M4 is configured to be connected to the first voltage terminal LVGL. In a case where the noise reduction control signal of the noise reduction control signal terminal RST is at an effective level (e.g., a high level), the fourth transistor M4 is turned on, and electrically connects the output terminal OP1 and the first voltage terminal LVGL, so that the scanning signal of the output terminal OP1 can be pulled down to a low level to perform noise reduction.

It should be noted that in the embodiments of the present disclosure, the shift register unit is not limited to the circuit structure described above, but may also include more transistors and capacitors to realize more perfect functions. The shift register unit may be of any circuit structure, and the specific circuit structure may be referred to conventional design and is not described in detail here.

To sum up, according to the array substrate provided by this exemplary embodiment, on the one hand, the purpose of balancing the drive capability and the load without adding additional compensation circuits can be realized, by respectively driving the first area in at least one side (e.g., both sides) of the slotting area and the second area that does not overlap with the first area in the display area with GOA units of different drive capabilities. Not only the problem of non-uniformity of brightness can be alleviated, but also the narrow frame of the display screen can be realized because the frame of the slotting area of the display screen does not increase without adding additional compensation circuits. On the other hand, due to the setting of the transition area, the brightness of the first area and the brightness of the second area can smoothly change to achieve a better uniform display effect. In addition, some pixel units are absent in the slotting area, and the load of each row of the GOA units is actually reduced compared with the load of the GOA units in the non-slotting area, so the size of the drive transistor of the GOA units in the slotting area is smaller than the size of the drive transistor of the GOA units in the non-slotting area, which can effectively reduce the frame of the slotting area.

Figure 10:
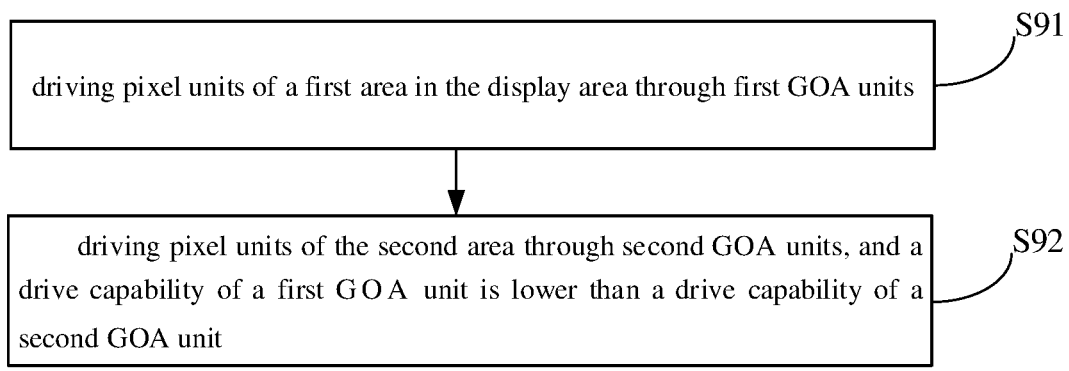
FIG. 10 is a flowchart of a method of driving an array substrate provided by still other exemplary embodiments of the present disclosure.

FIG. 10 is a flow chart of a method of driving an array substrate provided by some embodiments of the present disclosure. The method of driving the array substrate may include following steps.

As illustrated in FIG. 10, in step S91, pixel units of a first area in a display area are driven by first GOA units, the first area is in at least one side of a slotting area, and the display area further includes a second area that does not overlap with the first area.

As illustrated in FIG. 10, in step S92, pixel units in the second area are driven by second GOA units, and a drive capability of a first GOA unit is lower than a drive capability of a second GOA unit.

For example, the display area further includes a transition area between the first area and the second area. The method further includes: driving pixel units in the transition area by third GOA units. For example, a drive capability of a third GOA unit is between the drive capability of the first GOA unit and the drive capability of the second GOA unit.

In summary, in the method of driving the array substrate, the drive capability of the corresponding GOA unit can be adjusted according to the change of the amount of pixel units caused by the slotting area, so as to achieve the balance between the drive capability and the load, and alleviate the problem of non-uniformity of brightness of the display screen. By using the method, it does not need to add an additional compensation circuit, so the frame of the slotting area of the display screen does not increase, so as to realize the narrow frame of the display screen.

Figure 11:
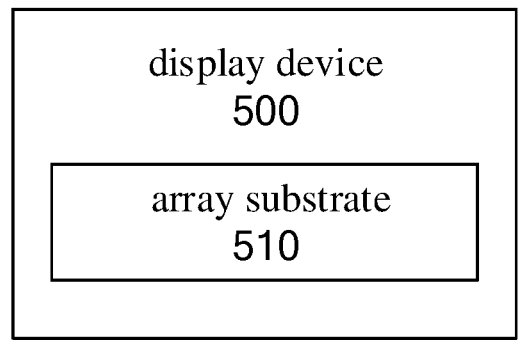
FIG. 11 is a schematic block diagram of a display device provided by some exemplary embodiments of the present disclosure.

Based on the above, the present disclosure also provides a display device in other exemplary embodiments. As illustrated in FIG. 11, a display device 500 includes an array substrate 510, and the array substrate 510 is the array substrate described in the above embodiments.

It should be noted that the display device 500 can be any product or component having display function, such as a display panel, an electronic paper, a mobile phone, a tablet computer, a television, a display, a notebook computer, a digital photo frame, a navigator, etc.

In addition, the display device 500 can achieve the same effects as those of the above array substrate, which are not described here again.

It should be clearly understood that the present disclosure describes how to form and use specific examples, but the principles of the present disclosure are not limited to any details of these examples. On the contrary, these principles can be applied to many other embodiments based on the teachings of the present disclosure.

Exemplary embodiments of the present disclosure have been particularly illustrated and described above. It should be understood that the present disclosure is not limited to the detailed structure, arrangement or implementation method described herein; and on the contrary, the present disclosure is intended to cover various modifications and equivalent arrangements included within the spirit and scope of the appended claims.

What is claimed is:

1. An array substrate, comprising: a display area, a slotting area, and a peripheral area around the display area, wherein the display area comprises: a first area, which is on at least one side of the slotting area, and a second area which does not overlap with the first area, and wherein the array substrate further comprises:
a plurality of pixel units in the display area and arranged in a plurality of rows; and
a gate drive circuit in the peripheral area,
the gate drive circuit comprises: a plurality of first shift register units, which are configured to drive a plurality of rows of pixel units in the first area, and a plurality of second shift register units which are configured to drive a plurality of rows of pixel units in the second area, wherein
a drive capability of each first shift register unit is lower than a drive capability of each second shift register unit, wherein the display area further comprises a transition area, and the transition area is between the first area and the second area, wherein the gate drive circuit further comprises a plurality of third shift register units configured to drive a plurality of rows of pixel units in the transition area, wherein a drive capability of each third shift register unit is between the drive capability of each first shift register unit and the drive capability of each second shift register unit, and the plurality of third shift register units have a same drive capability, the transition area is an area where the plurality of rows of pixel units driven by the plurality of third shift register units, which have the same drive capability and the drive capability of which is between the drive capability of each first shift register unit and the drive capability of each second shift register unit, are located, and a ratio of a height of the transition area to a height of the slotting area ranges from 1/3 to 1/2.

2. The array substrate according to claim 1, wherein drive capabilities of the plurality of first shift register units are different, amounts of pixel units in respective rows in the plurality of rows of pixel units driven by the plurality of first shift register units are different, and the drive capability of a respective first shift register unit is in a positive correlation with an amount of pixel units in a row corresponding to the respective first shift register unit.

3. The array substrate according to claim 2, wherein amounts of pixel units in respective rows in the first area gradually decrease in a direction away from the second area, and drive capabilities of first shift register units corresponding to the respective rows gradually decrease.

4. The array substrate according to claim 1, wherein each first shift register unit comprises a first drive transistor, each second shift register unit comprises a second drive transistor, each third shift register unit comprises a third drive transistor, the drive capability of each first shift register unit is in a positive correlation with a width-to-length ratio of a channel of the first drive transistor, the drive capability of each second shift register unit is in a positive correlation with a width-to-length ratio of a channel of the second drive transistor, and the drive capability of each third shift register unit is in a positive correlation with a width-to-length ratio of a channel of the third drive transistor.

5. The array substrate according to claim 4, wherein each of each first shift register unit, each second shift register unit, and each third shift register unit comprises:

an input circuit, connected to a first node and configured to write an input signal to the first node in response to the input signal; and an output circuit, connected to the first node and configured to output a clock signal that is received to an output terminal under control of a level of the first node, wherein an output circuit of each first shift register unit comprises the first drive transistor, an output circuit of each second shift register unit comprises the second drive transistor, and an output circuit of each third shift register unit comprises the third drive transistor.

6. The array substrate according to claim 4, wherein the width-to-length ratio of the channel of the first drive transistor is less than the width-to-length ratio of the channel of the third drive transistor, and the width-to-length ratio of the channel of the third drive transistor is less than the width-to-length ratio of the channel of the second drive transistor.

7. The array substrate according to claim 1, wherein the first area is on both sides of the slotting area.

8. A display device, comprising the array substrate according to claim 1.

9. A method of driving an array substrate, wherein the array substrate comprises a display area, a slotting area, and a peripheral area around the display area, the method of driving the array substrate comprising:

driving pixel units of a first area in the display area through first shift register units, the first area being on at least one side of the slotting area, and the display area further comprising a second area which does not overlap with the first area; and driving pixel units of the second area through second shift register units, wherein a drive capability of each first shift register unit is lower than a drive capability of each second shift register unit, wherein the display area further comprises a transition area, the transition area is between the first area and the second area, and the method further comprises:

driving pixel units of the transition area through third shift register units, wherein a drive capability of each third shift register unit is between the drive capability of each first shift register unit and the drive capability of each second shift register unit, wherein the third shift register units have a same drive capability, the transition area is an area where the pixel units driven by the third shift register units, which have the same drive capability and the drive capability of which is between the drive capability of each first shift register unit and the drive capability of each second shift register unit, are located, and a ratio of a height of the transition area to a height of the slotting area ranges from 1/3 to 1/2.

* * * * *